(12) United States Patent
Fossum (10) Patent No.: US 7,026,596 B2
(45) Date of Patent: Apr. 11, 2006

(54) HIGH-LOW SENSITIVITY PIXEL

(75) Inventor: Eric R. Fossum, La Canada, CA (US)

(73) Assignee: Micron Technology, Inc., Boise, ID (US)

( * ) Notice: Subject to any disclaimer, the term of this patent is extended or adjusted under 35 U.S.C. 154(b) by 193 days.

(21) Appl. No.: 10/696,559

(22) Filed: Oct. 30, 2003

(65) Prior Publication Data

US 2005/0092894 A1    May 5, 2005

(51) Int. Cl.
  *H01L 27/00*    (2006.01)
(52) U.S. Cl. .................... 250/208.1; 257/440; 348/310
(58) Field of Classification Search ............. 250/208.1; 257/440; 348/310
  See application file for complete search history.

(56) References Cited

U.S. PATENT DOCUMENTS 4,496,788 A * 1/1985 Hamakawa et al. ........ 136/249

6,693,670 B1 * 2/2004 Stark ........................... 348/308

* cited by examiner

*Primary Examiner*—David Porta
*Assistant Examiner*—Seung C. Sohn
(74) *Attorney, Agent, or Firm*—Dickstein Shapiro Morin & Oshinsky LLP (57) ABSTRACT

A pixel circuit, and a method for operating a high-low sensitivity (HLS) pixel circuit, to provide increased dynamic range in an imager. The pixel circuit combines a four transistor ("4T") and a three-transistor plus capacitor ("3TC") configuration in one pixel, where the 4T portion of the pixel is coupled to a high sensitivity buried photodiode region, and the 3TC portion of the pixel is coupled to a low sensitivity buried photodiode region. The pixel circuit first reads out charge from the high sensitivity photodiode region and compares it to a reset voltage, then reads out charge from the low sensitivity photodiode region. Under an alternate embodiment, multiple HLS pixels are coupled through a common floating diffusion node.

52 Claims, 7 Drawing Sheets

HIGH-LOW SENSITIVITY PIXEL

The present invention relates to a pixel circuit and related method of operating a pixel circuit to increase intrascene dynamic range while reducing fixed pattern noise.

BACKGROUND OF THE INVENTION

Intrascene dynamic range refers to the range of incident light that can be accommodated by an image sensor in a single frame of pixel data. Examples of scenes that generate high dynamic range incident signals include an indoor room with outdoor window, an outdoor scene with mixed shadows and bright sunshine, night-time scenes combining artificial lighting and shadows and, in an automotive context, an auto entering or about to leave a tunnel or shadowed area on a bright day.

Dynamic range is measured as the ratio of the maximum signal that can be meaningfully imaged by a pixel to its noise level in the absence of light. Typical CMOS active pixel sensors (and charge coupled device (CCD) sensors) have a dynamic range from 60 dB to 75 dB. This corresponds to light intensity ratios of about 1000:1 to about 5000:1. Noise in image sensors, including CMOS active pixel image sensors, is typically between 10 e-rms and 50 e-rms. The maximum signal accommodated is approximately 30,000 to 60,000 electrons. The maximum signal is often determined by the charge-handling capacity of the pixel or readout signal chain. Smaller pixels typically have smaller charge handling capacity.

Typical scenes imaged by cameras have lighting levels that generate signals on the order of 10 to 1,000 electrons under low light (i.e., 1 to 100 lux), 1000 to 10,000 electrons under indoor light conditions (i.e., 100 to 1000 lux), and 10,000 to >1,000,000 electrons (i.e., 1000 to 100,000 lux) under outdoor conditions. To accommodate lighting changes from scene to scene, i.e., the interscene dynamic range, an electronic shutter is used to change the integration time of all pixels in the arrays from frame to frame.

To cover a single scene that might involve indoor lighting (100 lux) and outdoor lighting (50,000 lux), the required intrascene dynamic range is on the order of 5,000:1 (assuming 10 lux of equivalent noise), corresponding to 74 dB. In digital bits, this requires 13 to 14 bits of resolution. However, most CMOS active pixel sensors have only 10 bits of output and 8 bits of resolution that are typically delivered to the user in most image formats such as JPEG. Companding of the data is often used to go from 10–12 bits to 8 bits. One type of companding is gamma correction, where roughly the square root of the signal is generated.

In order to accommodate high intrascene dynamic range, several different approaches have been proposed in the past. A common denominator of most approaches is performing signal companding within the pixel by having either a total conversion to a log scale (known as a logarithmic pixel) or a mixed linear and logarithmic response in the pixel.

These prior approaches have several major drawbacks. First, the "knee point" in a linear-to-log transition is difficult to control, leading to fixed pattern noise in the output image. Second, under low light, the log portion of the circuit is slow to respond, leading to lag. Third, a logarithmic representation of the signal in the voltage domain (or charge domain) means that small variations in signal due to fixed pattern noise will lead to large variations in the represented signal.

Linear approaches have also been described where the integration time is varied during a frame to generate several different signals. This approach has architectural problems if the pixel is read out at different points in time since data must be stored in an on-board memory before the signals can be fused together. Another approach is to integrate two different signals in the pixel, one with low gain and one with high gain. However, the low gain portion of the pixel often presents color separation processing problems.

Furthermore, the idea of including capacitors in the pixel area has not been effectively developed, due to the limited area available on the pixel. Since the pixel area is primarily used for light detection and readout circuitry, capacitors have not been effectively implemented in the pixel structure.

BRIEF SUMMARY OF THE INVENTION

The present invention relates to increasing intrascene dynamic range for image capturing in a pixel circuit. Under one embodiment, a high-low sensitivity (HLS) pixel circuit comprises two separate pixels with a shared output diode (i.e., floating diffusion node). The output diode is coupled to a four transistor (4T) buried photodiode pixel circuit via a transfer gate, and is also connected to a three transistor plus capacitor (3TC) buried photodiode pixel circuit via a connecting gate. The 3TC circuit also includes a capacitor for storing charge from one of the buried photodiode regions. The combined pixels share common reset, source-follower and select transistors. Both pixel circuits are operated so that the pinning potential is set at a low value (e.g., less than 1 volt, or zero volts). In this manner, the pixels may be operated using lower operating voltages.

Under an alternate embodiment, several high-low sensitivity (HLS) pixels circuits are coupled together using a common output diode (i.e., floating diffusion node). Along with the output diode, the coupled HLS pixels also share a reset, source-follower, and select transistor, thus improving pixel density with a reduced chip area.

BRIEF DESCRIPTION OF THE DRAWINGS

These and other features and advantages of the invention will be more clearly seen from the following detailed description of the invention which is provided in connection with the accompanying drawings, in which.

DETAILED DESCRIPTION OF THE INVENTION

Figure 1:
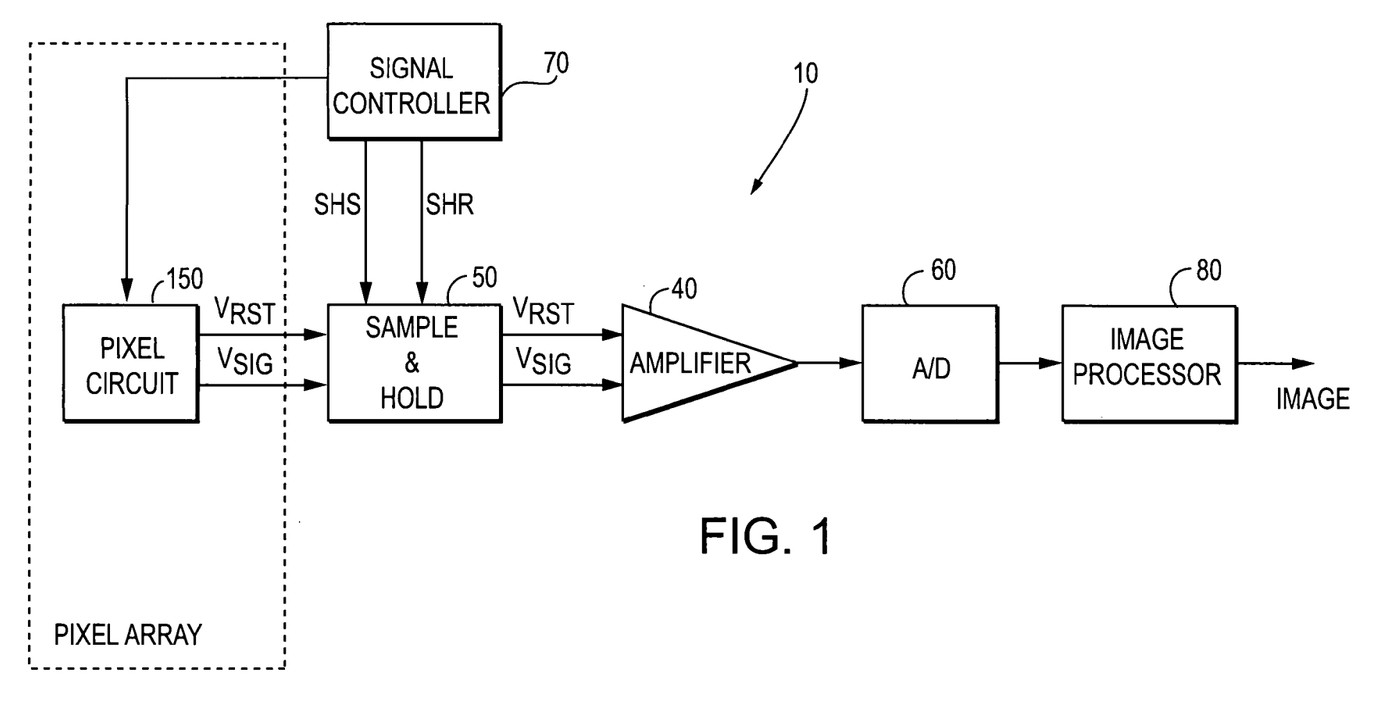
FIG. 1 is a block diagram of an exemplary imaging device of the present invention.

The present invention is used in a CMOS imaging device generally illustrated in FIG. 1 by reference numeral 10. The imaging device 10 includes an array of pixels arranged in rows and columns (not shown) with each pixel having a pixel circuit 150; each pixel in the array is associated with a column line to which all pixels of a same column are connected, the pixels being selected row-by-row. The pixel circuit 150 provides a reset signal VRST and a pixel image signal VSIG as outputs during reset and integration periods, respectively. The reset signal VRST and pixel image signal VSIG are then captured by a sample and hold circuit 50 associated with that column in response to sampling signals SHS (for the image signal) and SHR (for the reset signal), respectively. The sample and hold circuit 50 passes the sampled reset signal VRST and sampled image signal VSIG to an amplifier 40 which in turn provides a signal representing the difference between the reset signal and pixel image signal (VRST−VSIG) as an output. This difference signal is provided to an analog-to-digital converter 60 and, from there, to an image processor 80 that receives digitized pixel signals from all pixel circuits 150 of the pixel array and provides an image output.

Figure 2:
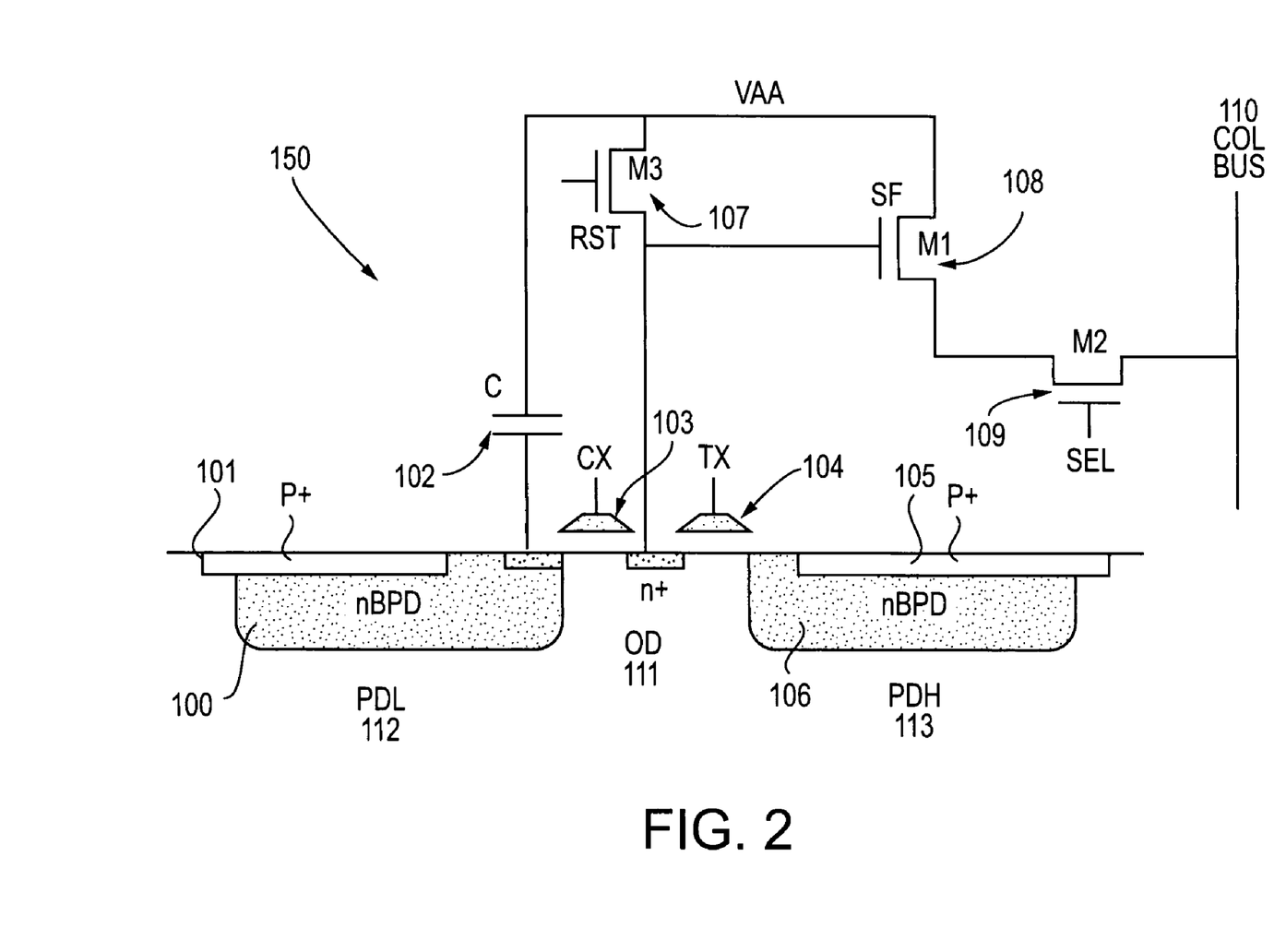
FIG. 2 is an exemplary high-low sensitivity pixel circuit in accordance with one aspect of the present invention.

An exemplary pixel circuit constructed in accordance with the present invention is generally illustrated in FIG. 2 by reference numeral 150. The pixel circuit 150 has two pixels combined into a single operational pixel. The first pixel is referred to as a buried (or "pinned") photodiode 4T cell, and is generally defined by the high sensitivity photodiode region (PDH) 113, transfer transistor 104, reset transistor 107, source-follower transistor 108 and select transistor 109. The second pixel is referred to as the buried (or "pinned") photodiode 3TC pixel, and is generally defined by low sensitivity photodiode region (PDL) 112, capacitor 102, reset transistor 107, source-follower transistor 108 and select transistor 109. The sensitivity of each diode region 112, 113 is predetermined through the doping of each respective region or through other diode structures or configurations. Capacitor 102 is preferably a poly-insulator-poly (PIP) type capacitor. PIP capacitors use electrically-conductive polysilicon for forming lower and upper electrodes, whereby oxidation occurs at an interface between the upper/lower electrodes and a dielectric layer so as to form natural oxide therebetween.

When using PIP capacitors in a small pixel (e.g., 5 μm×5 μm), the microlens (not shown) can be focused in a small footprint within the pixel (e.g., 2 μm×2 μm), where the rest of the pixel may be used for readout electronic circuitry. By using high value capacitors, smaller capacitor sizes may be implemented in the pixel circuit 150. For example, a PIP capacitor having a capacitance of 5–10 fF/μm$^2$ would provide over 100,000 e-/volt within a few square microns of footprint. Thus, it would be possible to integrate one or more capacitors in a pixel without adversely affecting pixel size, especially since the pixel size is limited by optic considerations and cannot scale indefinitely. It should be understood that other types of capacitors may also be used to effect the same results.

Turning back to FIG. 2, the pixel circuit 150 is modified so that the pinning potential of the photodiode is set at a low value (e.g., <1volt, or even 0 volts) to help the pixel to operate at a lower voltage. The floating diffusion node (or "output diode" OD) 111 is operationally coupled to the 4T pixel circuit via transfer transistor 104. Transfer transistor 104 controls the flow of charge accumulated in the photodiode (shown generally as n-type material 106 underneath a p-type layer 105) in the PDH region 113. Connecting transistor 103 couples the 3TC circuit to the floating diffusion node 111, and controls the flow of charge accumulated in the photodiode (shown generally as n-type material 100 underneath a p-type layer 101) in the PDL region 112.

The combined 4T and 3TC pixels share a common reset transistor 107, source-follower transistor 108, select transistor 109 and common column busline 110. After an integration period, charge is accumulated in the PDL region 112 and the PDH region 113 proportional to the light flux incident on each photodiode. Because of the different sensitivities of each photodiode region 112, 113, the collection area of the photodiodes may be unequal.

Figure 3:
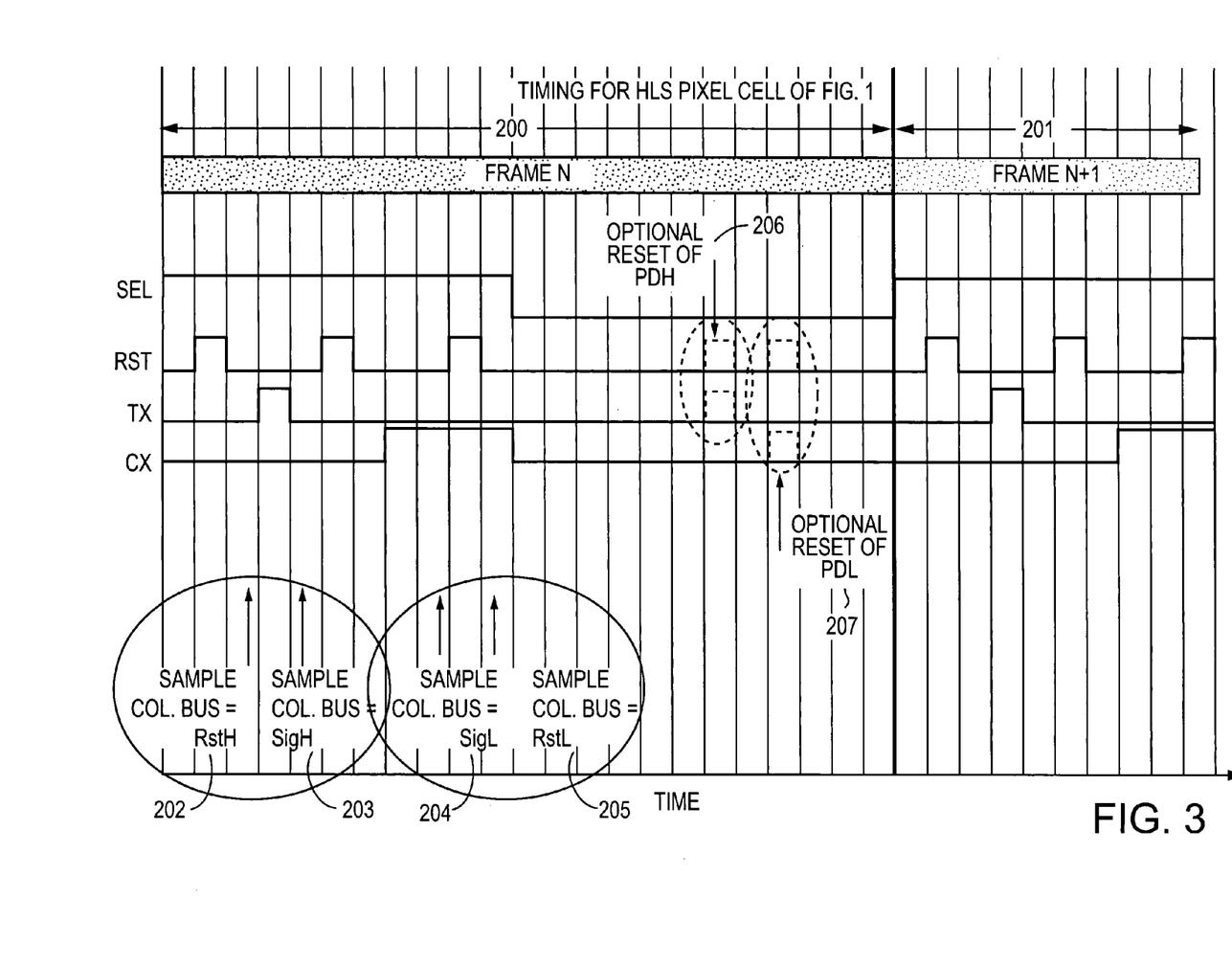
FIG. 3 is a timing diagram for the circuit of FIG. 2.

FIG. 3 illustrates an exemplary timing diagram for the circuit of FIG. 2. The timing diagram illustrates the signal timing within a first 200 and second 201 frame period. At the beginning of a frame period, the SEL line is triggered high to activate transistor 109. Subsequently, the floating diffusion region 111 is reset by pulsing a high RST signal to the gate terminal of reset transistor 107. After being reset, the floating diffusion region 111 is read out onto the column line via transistors 108 and 109 and sampled (see time 202). Transfer transistor 104 is activated when signal TX goes high, allowing the charge accumulated in the PDH region 113 to spill over to the floating diffusion region 111. The accumulated voltage is subsequently read out and sampled (see time 203), where the difference between the two voltages is proportional to the charge accumulated in the PDH region 113.

After the accumulated voltage is read out, the floating diffusion region is reset once again with a RST pulse, and connecting transistor 103 is activated when connecting control signal CX goes high. Once transistor 103 is activated, accumulated charge from the PDL region 112 spills over into the floating diffusion region 111. The accumulated voltage at floating diffusion region 111 is read out and sampled (see time 204) from the column busline 110. While connecting control signal CX remains high, the PDL region 112 is reset again by reset pulse RST and the resulting voltage on the floating diffusion region 111 is sampled (see time 205). The difference between the two sampled voltages (obtained at 204 and 205) is proportional to the charge accumulated in the PDL region 112.

Following the readout of the four samples (202–205), the PDL region 112 and the PDH region 113 may be concurrently or separately reset an additional time to further control the integration of each photodiode region. The dotted lines under times 206 and 207 illustrate a separate resetting of the PDH 113 and PDL 112 regions.

It should be noted that the sizing of various components may add to the performance of the circuit of FIG. 2. For example, it is preferable that the capacitance of the floating diffusion region 111 is small (as low as 1fF). By keeping the capacitance of the floating diffusion region 111 low, read noise from the equivalent conversion gain of the PDH region 113 will be reduced. Thus, assuming a 1 fF capacitance, the equivalent conversion gain for the PDH region 113 would be 160 μV/e-. Since the correlated double sampling (CDS) of the floating diffusion region 111 for the PDH region 113 will suppress kTC noise, the read noise will be limited by the signal chain. Further, assuming the signal chain contribution to be approximately 150 μV rms, the read noise would be approximately 1 e- rms. If a 1 volt swing is designed for the floating diffusion region 111, then the full well signal for the floating diffusion region 111 would be approximately 6250 e- with a concomitant noise of 79 e- rms.

Furthermore, the capacitance of the PDL region 112 should be as large as possible, taking into consideration kTC noise associated with the shot noise of a full well PDH, as well as footprint size within the pixel area. The larger capacitance helps to extend the bright light limit to be as large as possible. As an example, if 5,000 e- is an effective full well for PDH region 113, the shot noise would be approximately 70 e- rms. Further assuming a soft reset of the PDL region 112, the read noise would be $$\sqrt{\frac{kTC}{q}},$$

or approximately 30 fF for 70 e- rms. This would then require an area between 3–6 $\mu m^2$. This capacitance corresponds to a full well of about 187,000 e- for a 1 volt swing. Under this example, the dynamic range would be 20 log (187,000/1), or about 105 dB.

Still referring to FIGS. 2–3, the pixel data collected from the two CDS samples represents approximately 17 bits of dynamic range, using the values given above. Each of the double-samples are digitally converted (A/D) separately and the two resulting digital values are subsequently combined. For the combining process, each A/D conversion should be, preferably, approximately 10–12 bits to avoid excessive quantization during the combination of the digital signals. Mapping the data back to 8 or 10 bits for display purposes may require additional signal processing, which may be included on-chip. Additional enhancements may be made through converting a single sample at multiple gains.

Figure 4:
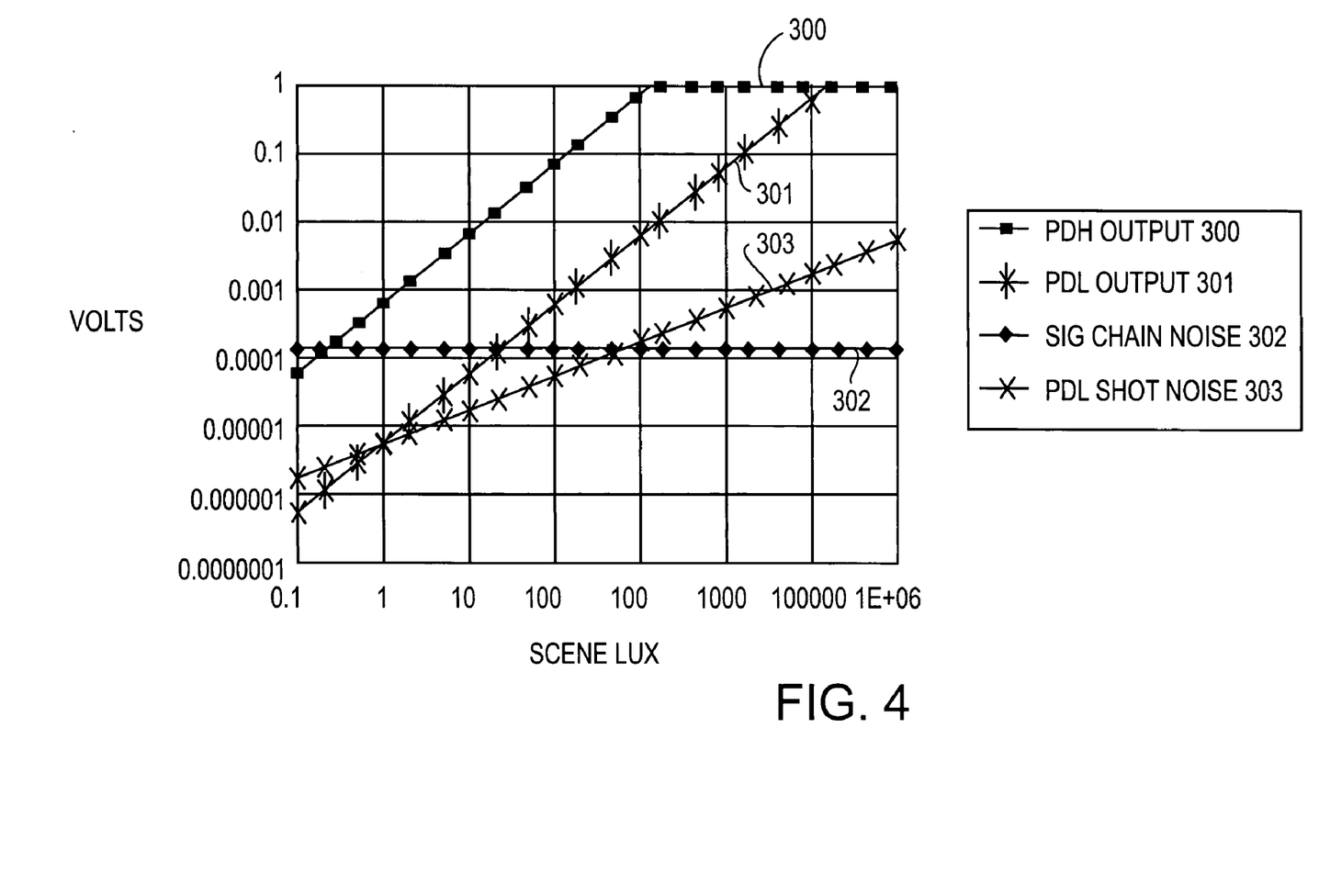
FIG. 4 illustrates the voltage v. green scene lux relationship for the pixel circuit of FIG. 2.

FIG. 4 is a graph illustrating exemplary responses of the FIG. 2 circuit 150. The graph shows the response in terms of voltage versus scene lux, and simultaneously shows the PHD output 300, the PDL output 301, signal chain noise 302 and PDL shot noise 303. In the example of FIG. 4, the illustrated outputs are based on a 50% scene reflectivity, with a 2×2 µm PDH area and a 1×1 µm PDL area, both having 100% integration duty cycle, and both with 50% QE over the PD area. The PDH region (see output 300) is limited by photon shot noise over most of the range shown in FIG. 4 until about 1000 lux, where the shot noise becomes limited. The PDL region is limited by kTC noise (see output 301).

Figure 5:
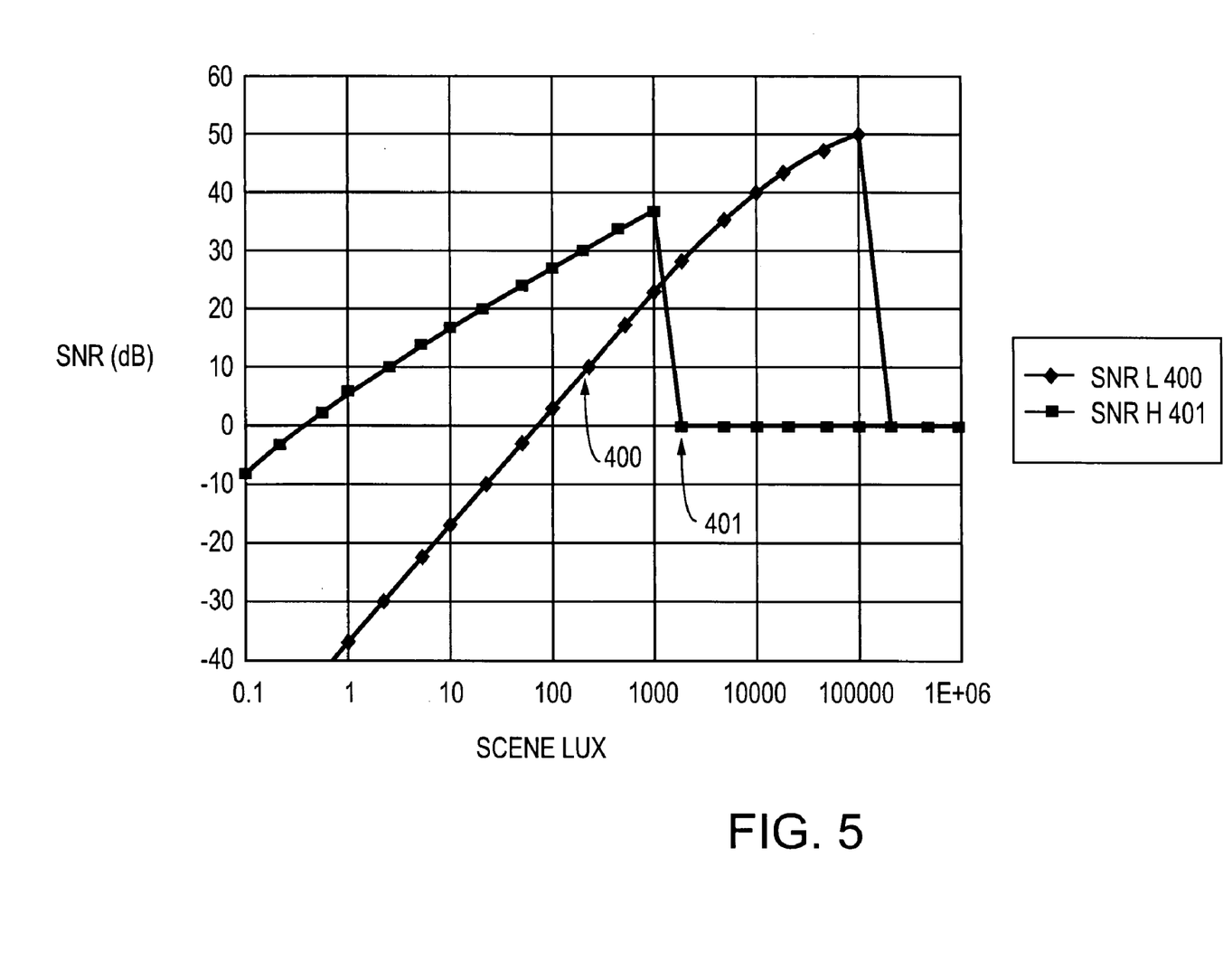
FIG. 5 illustrates the signal-to-noise ratio v. green scene lux relationship for the pixel circuit of FIG. 2.

FIG. 5 illustrates the signal-to-noise ratio (SNR) of the PDL region (shown in FIG. 5 as "SNR L" 400) and PDH region (shown in FIG. 5 as "SNR H" 401), where the SNR is approximately set to zero for saturation. As can be seen from the exemplary illustration, the high sensitivity SNR H region has the better SNR response. For the SNR H signal 401, the SNR increases steadily until about 1000 lux, where the SNR drops to zero. For the SNR L signal 400, the SNR increases steadily until about 100,000 lux, where the SNR drops to zero. It should be noted that signal processing needs to be arranged so that a smooth switchover to the low sensitivity signal is achieved before the high sensitivity signal saturates.

Figure 6:
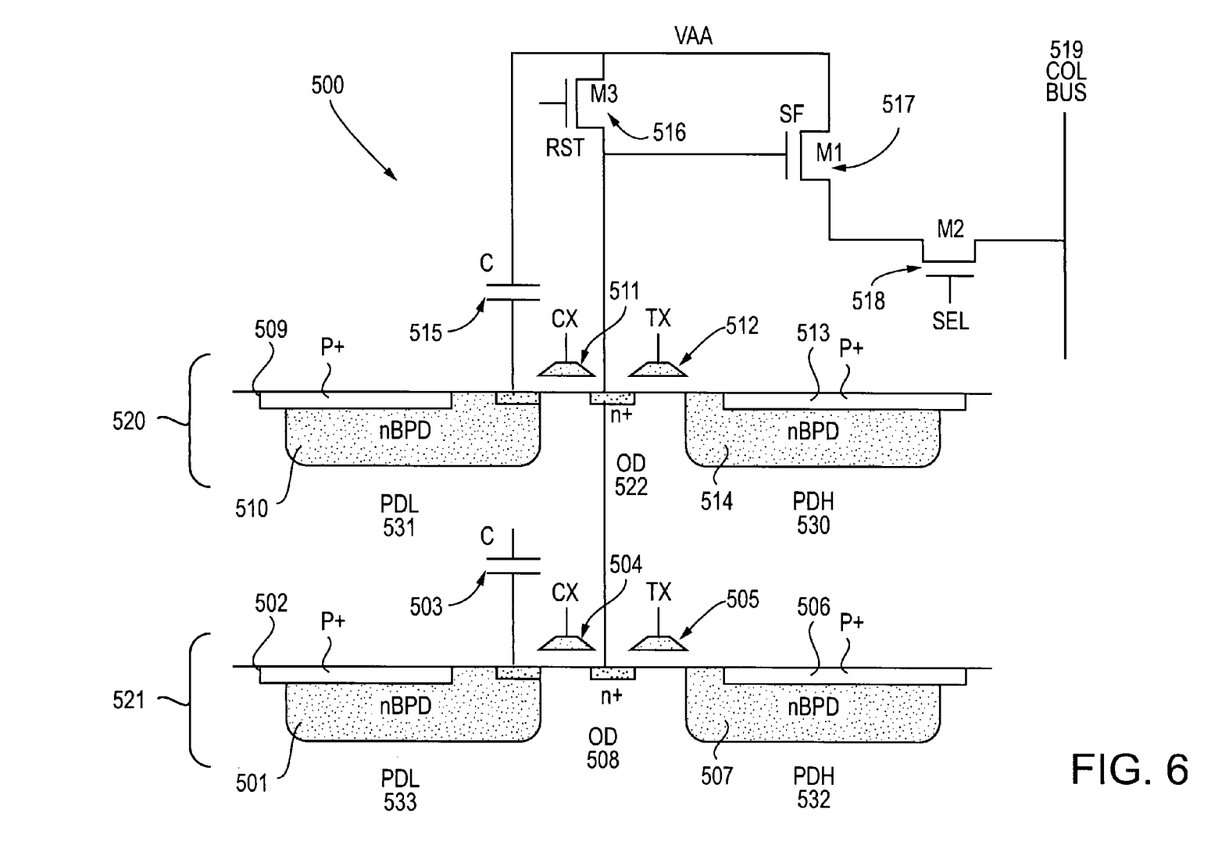
FIG. 6 is another embodiment of the invention, where several high-low sensitivity pixels are coupled to a common output diode node.

FIG. 6 illustrates a circuit 500 that combines two high-low sensitivity circuits 520, 521 using a common floating diffusion region (or "output diode"). Circuit 520 is substantially similar to the circuit described in FIG. 2. The pixel circuit 520 generally consists of two pixels combined into a single operational pixel. The first pixel is referred to as a buried (or "pinned") photodiode 4T cell, and is generally defined by the high sensitivity photodiode region (PDH) 530, transfer transistor 512, reset transistor 516, source-follower transistor 517 and select transistor 518. The second pixel is referred to as the buried (or "pinned") photodiode 3TC pixel, and is generally defined by low sensitivity diode region (PDL) 531, capacitor 515, reset transistor 516, source-follower transistor 517 and select transistor 518. Capacitor 515 is preferably a PIP-type capacitor.

The pixel structure in FIG. 6 is modified so that the pinning potential is set at a low value (e.g., <1 volt, or even 0 volts) to help the pixel to operate at a lower voltage. The floating diffusion region 522 is operationally coupled to the 4T pixel circuit via transfer gate 512. Transfer gate 512 controls the flow of charge accumulated in the photodiode (shown generally as n-type material 514 underneath a p-type layer 513) in the PDH region 530. Connecting transistor 511 couples the 3TC circuit to the floating diffusion node 522, and controls the flow of charge accumulated in the photodiode (shown generally as n-type material 510 underneath a p-type layer 509) in the PDL region 531.

The combined 4T and 3TC pixels share a common reset transistor 516, source-follower transistor 517, select transistor 518 and column busline 519. The floating diffusion region 522 of circuit 520 is also coupled to the floating diffusion region 508 of circuit 521. Circuit 521 has a transfer gate 505, which controls the flow of charge accumulated in the high sensitivity photodiode (shown generally as n-type material 507 underneath a p-type layer 506) in the PDH region 532. Connecting transistor 504 couples the 3TC circuit to the floating diffusion region 508, and controls the flow of charge accumulated in the low sensitivity photodiode (shown generally as n-type material 501 underneath a p-type layer 502) in the PDL region 533. The photodiode in the PDL region 533 is further coupled to capacitor 503.

During operation, both PDL 531, 533 and PDH 530, 532 regions are reset via reset transistor 516 by reset signal RST. The transfer transistors 505, 512 and the connecting transistors 504, 511 should preferably be held at a bias that is slightly more positive than reset transistor 516. As each PDH region 530, 532 accumulates charge and saturates during an integration period, the charge will flow under transfer transistors 505, 512, through the floating diffusion regions 508, 522 (after filling the regions), under connecting transistor 504, 511 and on to PDL regions 531, 533.

For readout, connecting transistors 504, 511 are turned on, and the voltage resulting from the sharing of charge between the floating diffusion 508, 522 and the PDL regions 531, 533 is read out through transistors 517, 518 and sampled. After pulsing the reset signal at transistor 516, the resulting voltage on the shared floating diffusion regions 508, 522 is read out and sampled. Connecting transistors 504, 511 are then turned off, another reset pulse RST is applied to transistor 516, and the voltage on the shared floating diffusion regions 508, 522 is read out and sampled again. Transfer transistors 505, 512 are then activated to allow charge to transfer from the PDH region 530, 532 to the shared floating diffusion region 508, 522. The resulting PDH voltage is then read out and sampled.

The PDH voltage being sampled will have low noise characteristics. The advantage of this readout method is that all photo-signals can be received via the PDH region. The result of this technique is that only the PDH region would require a microlens and color filter; the PDL region could be kept in the dark.

Figure 7:
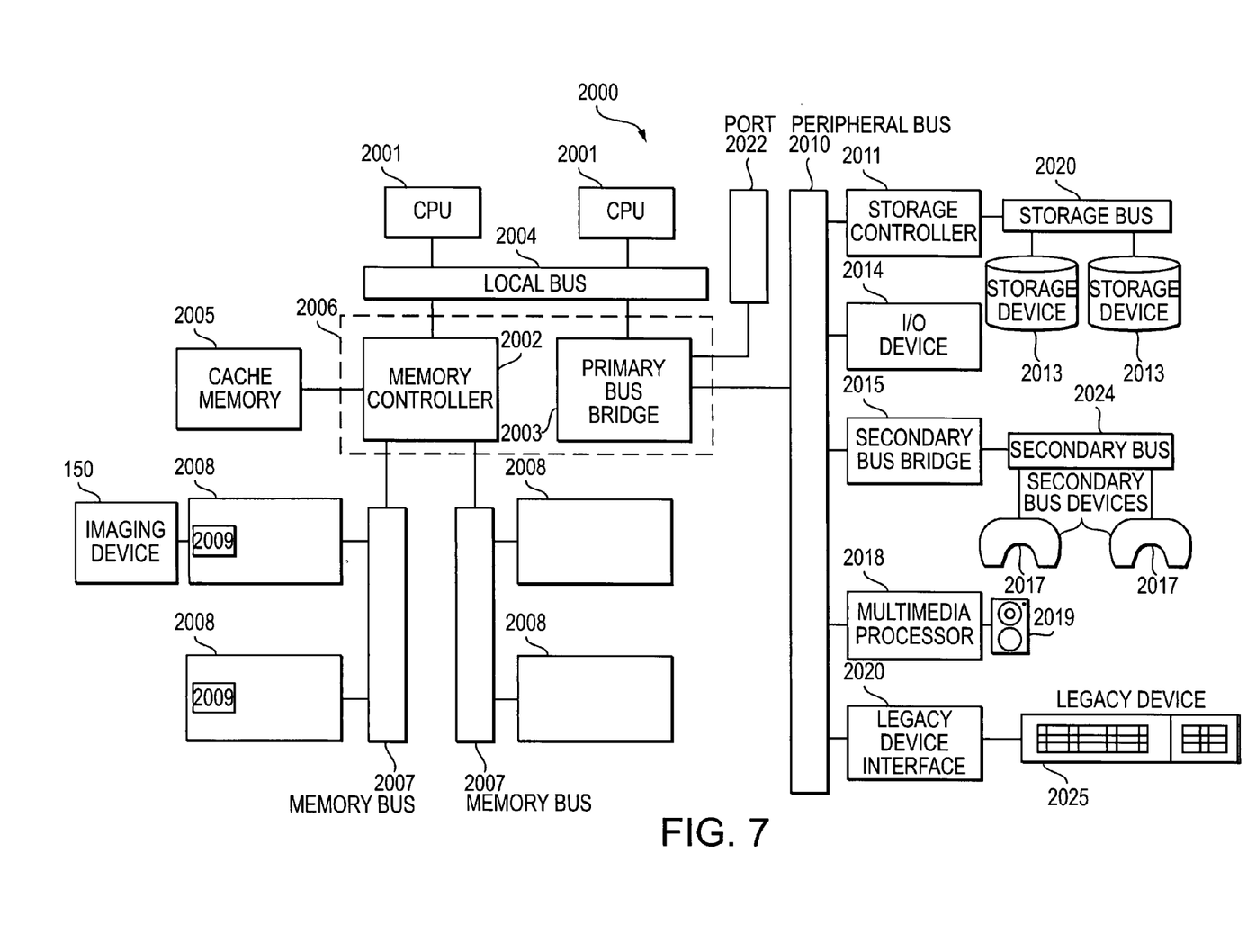
FIG. 7 depicts a block diagram of a processor system employing the pixel circuits of FIG. 2–FIG. 6, in accordance with yet another exemplary embodiment of the invention.

FIG. 7 illustrates an exemplary processing system 2000 which utilizes a pixel circuit such as that described in connection with FIGS. 2–6. The processing system 2000 includes one or more processors 2001 coupled to a local bus 2004. A memory controller 2002 and a primary bus bridge 2003 are also coupled the local bus 2004. The processing system 2000 may include multiple memory controllers 2002 and/or multiple primary bus bridges 2003. The memory controller 2002 and the primary bus bridge 2003 may be integrated as a single device 2006.

The memory controller 2002 is also coupled to one or more memory buses 2007. Each memory bus accepts memory components 2008. Any one of memory components

2008 may contain a high-low pixel circuit 150 or any other pixel circuits as described in connection with FIGS. 1–6.

The memory components 2008 may be a memory card or a memory module. The memory components 2008 may include one or more additional devices 2009. For example, in a SIMM or DIMM, the additional device 2009 might be a configuration memory, such as a serial presence detect (SPD) memory. The memory controller 2002 may also be coupled to a cache memory 2005. The cache memory 2005 may be the only cache memory in the processing system. Alternatively, other devices, for example, processors 2001 may also include cache memories, which may form a cache hierarchy with cache memory 2005. If the processing system 2000 include peripherals or controllers which are bus masters or which support direct memory access (DMA), the memory controller 2002 may implement a cache coherency protocol. If the memory controller 2002 is coupled to a plurality of memory buses 2007, each memory bus 2007 may be operated in parallel, or different address ranges may be mapped to different memory buses 2007.

The primary bus bridge 2003 is coupled to at least one peripheral bus 2010. Various devices, such as peripherals or additional bus bridges may be coupled to the peripheral bus 2010. These devices may include a storage controller 2011, a miscellaneous I/O device 2014, a secondary bus bridge 2015, a multimedia processor 2018, and a legacy device interface 2020. The primary bus bridge 2003 may also be coupled to one or more special purpose high speed ports 2022. In a personal computer, for example, the special purpose port might be the Accelerated Graphics Port (AGP), used to couple a high performance video card to the processing system 2000.

The storage controller 2011 couples one or more storage devices 2013, via a storage bus 2020, to the peripheral bus 2010. For example, the storage controller 2011 may be a SCSI controller and storage devices 2013 may be SCSI disc drives. The I/O device 2014 may be any sort of peripheral. For example, the I/O device 2014 may be an local area network interface, such as an Ethernet card. The secondary bus bridge 2015 may be used to interface additional devices via another bus 2024 to the processing system 2000. For example, the secondary bus bridge 2015 may be an universal serial port (USB) controller used to couple USB devices 2017 via to the processing system 2000. The multimedia processor 2018 may be a sound card, a video capture card, or any other type of media interface, which may also be coupled to one additional device such as speakers 2019. The legacy device interface 2020 is used to couple legacy devices 2025, for example, older styled keyboards and mice, to the processing system 2000.

The processing system 2000 illustrated in FIG. 7 is only an exemplary processing system with which the invention may be used. While FIG. 7 illustrates a processing architecture especially suitable for a general purpose computer, such as a personal computer or a workstation, it should be recognized that well known modifications can be made to configure the processing system 2000 to become more suitable for use in a variety of applications. For example, many electronic devices which require processing may be implemented using a simpler architecture which relies on a CPU 2001 coupled to memory components 2008 and/or memory devices 2009. The modifications may include, for example, elimination of unnecessary components, addition of specialized devices or circuits, and/or integration of a plurality of devices.

Other circuits containing the pixel circuits described in this disclosure include circuitry for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A pixel circuit, comprising:
    a first photodiode region having a first light sensitivity, said photodiode region being coupled to a first floating diffusion region through a transfer transistor;
    a readout circuit, said readout circuit being coupled to the first floating diffusion region;
    a second photodiode region having a second light sensitivity, said photodiode region being coupled to the first floating diffusion region through a connecting transistor; and
    a capacitive element, said capacitive element being coupled to the second photodiode region, and further coupled to the readout circuit.

2. The pixel circuit of claim 1, wherein the readout circuit comprises a reset transistor, said reset transistor being configured for resetting the first floating diffusion region.

3. The pixel circuit of claim 2, wherein the readout circuitry further comprises a source-follower transistor, said source-follower transistor having a source terminal coupled to said capacitive element, a gate terminal coupled to the drain terminal of the reset transistor, and a drain terminal coupled to a source terminal of a select transistor, said select transistor having a gate terminal coupled to a select line, and a drain terminal coupled to an output bus line.

4. The pixel circuit of claim 1, wherein the capacitive element is a poly-insulator-poly type capacitor.

5. The pixel circuit of claim 4, wherein the capacitance of said capacitor is in the range of 5 $fF/\mu m^2$ to 10 $fF/\mu m^2$.

6. The pixel circuit of claim 1, wherein the first light sensitivity is higher than the second light sensitivity.

7. The pixel circuit of claim 1, wherein the capacitance of the first floating diffusion region is less than the capacitance of the capacitive element.

8. The pixel circuit of claim 1, wherein the first and second photodiode regions comprise pinned photodiodes.

9. The pixel circuit according to claim 8, wherein a pinned potential is less than 1 volt.

10. The pixel circuit of claim 1, wherein the first and second photodiode regions comprise buried photodiodes.

11. The pixel circuit of claim 1, further comprising:
    a third photodiode region having the first light sensitivity, said third photodiode region being coupled to a second floating diffusion region through a second transfer transistor, said second floating diffusion region being coupled to the first floating diffusion region;

a fourth photodiode region having the second light sensitivity, said fourth photodiode region being coupled to the second floating diffusion region through a second connecting transistor; and a second capacitive element, said second capacitive element being coupled to the second low-sensitivity photodiode region, and further coupled to the readout circuit.

12. A method of operating a pixel during a frame period, comprising:

resetting and sampling a floating diffusion region to obtain a first signal;

transferring charge from a first photodiode region having a first light sensitivity to the floating diffusion region, said charge being subsequently read out and sampled to obtain a second signal;

resetting the floating diffusion region;

transferring charge from a second photodiode region having a second light sensitivity to the floating diffusion region;

reading out and sampling the transferred charge to obtain a third signal;

resetting the floating diffusion region while charge is being transferred from the second photodiode region; and reading out and sampling a remaining voltage to obtain a fourth signal prior to the end of the frame period.

13. The method of claim 12, further comprising the step of subtracting the first signal from the second signal to obtain a first photodiode signal.

14. The method of claim 13, wherein the first photodiode signal is a high sensitivity photodiode signal.

15. The method of claim 12, further comprising the step of subtracting the third signal from the fourth signal to obtain a second photodiode signal.

16. The method of claim 15, wherein the second photodiode signal is a low sensitivity photodiode signal.

17. The method of claim 12, further comprising the step of resetting the first photodiode region and the floating diffusion region after the remaining voltage is read out, and before the end of the frame period.

18. The method of claim 17, further comprising the step of resetting the second photodiode region and the floating diffusion region after the first photodiode region and the floating diffusion region are reset, and prior to the end of the frame period.

19. A pixel circuit, comprising:

a first photodiode region having a first sensitivity characteristic, said first photodiode region being coupled to a floating diffusion node through a transfer transistor;

a second photodiode region having a second sensitivity characteristic, said second photodiode region being coupled to the floating diffusion node through a connecting transistor;

a reset transistor connected to and for resetting the floating diffusion region;

a readout circuit connected to and for reading out the voltage on the floating diffusion region; and a capacitive element, said capacitive element being coupled to the second photodiode region, and further coupled to a voltage line.

20. The pixel circuit of claim 19, wherein the capacitive element is a poly-insulator-poly type capacitor.

21. The pixel circuit of claim 20, wherein the capacitance of said capacitor is in the range of 5 fF/$\mu m^2$ to 10 fF/$\mu m^2$.

22. The pixel circuit of claim 19, wherein the first sensitivity characteristic is higher than the second sensitivity characteristic.

23. The pixel circuit of claim 19 wherein the readout circuit comprises a source-follower transistor coupled to a select transistor, said source-follower transistor being further coupled to the reset transistor and to the voltage line, and said select transistor being further coupled to a select line and an output bus line.

24. The pixel circuit of claim 19, wherein the pixel circuit further comprises:

a third photodiode region having said first sensitivity characteristic, said third photodiode region being coupled to a second floating diffusion node through a second transfer transistor, said second floating diffusion node being coupled to the floating diffusion node;

a fourth photodiode region having said second sensitivity characteristic, said low sensitivity photodiode region being coupled to the second floating diffusion node through a second connecting transistor; and a second capacitor, said second capacitor coupled to the fourth photodiode region, and further coupled to the readout circuit.

25. The pixel circuit of claim 24, wherein the first sensitivity characteristic is greater than the second sensitivity characteristic.

26. A method of operating a pixel during a frame period, comprising the steps of:

resetting and sampling a floating diffusion region to obtain a first signal;

saturating a plurality of high-sensitivity photodiode regions to allow accumulated charge to flow to a plurality of low-sensitivity photodiode regions through said floating diffusion region;

reading out and sampling the charge on the plurality of low-sensitivity photodiode regions through the floating diffusion region to obtain a second signal;

resetting and sampling the floating diffusion region to obtain a third signal; and reading out and sampling the charge on the plurality of high-sensitivity photodiode region through the floating diffusion region to obtain a fourth signal.

27. The method of claim 26, further comprising the step of subtracting the first signal from the second signal to obtain a low-sensitivity photodiode signal.

28. The method of claim 27, further comprising the step of subtracting the third signal from the fourth signal to obtain a high-sensitivity photodiode signal.

29. The method of claim 26, further comprising the step of resetting the plurality of high-sensitivity photodiode region and the floating diffusion region after the remaining voltage is read out, and before the end of the frame period.

30. The method of claim 29, further comprising the step of resetting the plurality of low-sensitivity photodiode region and the floating diffusion region are again reset after the plurality of high-sensitivity photodiode region and the shared floating diffusion region are reset, and prior to the end of the frame period.

31. An integrated circuit, comprising:

a substrate, said substrate having a floating diffusion region;

a first photodiode region formed in said substrate, said first photodiode region having a first light sensitivity characteristic, said first photodiode region being coupled to the floating diffusion region through a transfer transistor formed on said substrate;

a readout circuit formed on said substrate, said readout circuit being coupled to the floating diffusion region;

a second photodiode region formed on said substrate having a second light sensitivity, said photodiode region being coupled to the floating diffusion region through a connecting transistor formed on said substrate; and a capacitive element formed on said substrate, said capacitive element being coupled to the second photodiode region, and further coupled to the readout circuit.

32. The integrated circuit of claim 31, wherein the readout circuit comprises a reset transistor formed on said substrate, said reset transistor being configured for resetting the floating diffusion region.

33. The integrated circuit of claim 32, wherein the readout circuitry further comprises a source-follower transistor formed on said substrate, said source-follower transistor having a source terminal coupled to said capacitive element, a gate terminal coupled to the drain terminal of the reset transistor, and a drain terminal coupled to a source terminal of a select transistor formed on said substrate, said select transistor having a gate terminal coupled to a select line, and a drain terminal coupled to an output bus line.

34. The integrated circuit of claim 31, wherein the capacitive element is a poly-insulator-poly type capacitor.

35. The integrated circuit of claim 34, wherein the capacitance of said capacitor is in the range of 5 fF/$\mu m^2$ to 10 fF/$\mu m^2$.

36. The integrated circuit of claim 31, wherein the first sensitivity is higher than the second sensitivity.

37. The integrated circuit of claim 31, wherein the capacitance of the floating diffusion region is less than the capacitance of the capacitive element.

38. The integrated circuit of claim 31, wherein the first and second photodiode regions comprise pinned photodiodes.

39. The integrated circuit according to claim 38, wherein the pinned potential is less than 1 volt.

40. The integrated circuit of claim 31, wherein the first and second photodiode regions comprise buried photodiodes.

41. The integrated circuit of claim 31, further comprising:
a third photodiode region formed on said substrate having the first light sensitivity, said third photodiode region being coupled to a second floating diffusion region formed on said substrate through a second transfer transistor, said second floating diffusion region being coupled to the floating diffusion region;

a fourth photodiode region formed on said substrate having the second light sensitivity, said fourth photodiode region being coupled to the second floating diffusion region through a second connecting transistor; and a second capacitive element formed on said substrate, said second capacitive element being coupled to the second low-sensitivity photodiode region, and further coupled to the readout circuit.

42. A processing system, comprising:
a processor;
an imaging circuit coupled to said processor, said imaging circuit having a pixel circuit, said pixel circuit comprising:

a first photodiode region having a first light sensitivity, said photodiode region being coupled to a first floating diffusion region through a transfer transistor;

a readout circuit, said readout circuit being coupled to the first floating diffusion region;

a second photodiode region having a second light sensitivity, said photodiode region being coupled to the first floating diffusion region through a connecting transistor; and a capacitive element, said capacitive element being coupled to the second photodiode region, and further coupled to the readout circuit.

43. The processing system of claim 42, wherein the readout circuit comprises a reset transistor, said reset transistor being configured for resetting the first floating diffusion region.

44. The processing system of claim 43, wherein the readout circuitry further comprises a source-follower transistor, said source-follower transistor having a source terminal coupled to said capacitive element, a gate terminal coupled to the drain terminal of the reset transistor, and a drain terminal coupled to a source terminal of a select transistor, said select transistor having a gate terminal coupled to a select line, and a drain terminal coupled to an output bus line.

45. The processing system of claim 42, wherein the capacitive element is a poly-insulator-poly type capacitor.

46. The processing system of claim 45, wherein the capacitance of said capacitor is in the range of 5 fF/$\mu m^2$ to 10 fF/$\mu m^2$.

47. The processing system of claim 42, wherein the first sensitivity is higher than the second sensitivity.

48. The processing system of claim 42, wherein the capacitance of the first floating diffusion region is less than the capacitance of the capacitive element.

49. The processing system of claim 42, wherein the first and second photodiode regions comprise pinned photodiodes.

50. The processing system according to claim 49, wherein a pinned potential is less than 1 volt.

51. The processing system of claim 42, wherein the first and second photodiode regions comprise buried photodiodes.

52. The processing system of claim 42, further comprising:
a third photodiode region having the first light sensitivity, said third photodiode region being coupled to a second floating diffusion region through a second transfer transistor, said second floating diffusion region being coupled to the first floating diffusion region;

a fourth photodiode region having the second light sensitivity, said fourth photodiode region being coupled to the second floating diffusion region through a second connecting transistor; and a second capacitive element, said second capacitive element being coupled to the second low-sensitivity photodiode region, and further coupled to the readout circuit.

* * * * *